(12) United States Patent
Sung et al.

(10) Patent No.: US 10,325,775 B2
(45) Date of Patent: Jun. 18, 2019

(54) SEMICONDUCTOR MEMORY DEVICE INCLUDING CAPACITORS

(71) Applicant: SK hynix Inc., Gyeonggi-do (KR)

(72) Inventors: Sang-Hyun Sung, Chungcheongbuk-do (KR); Jeong-Hwan Kim, Gyeonggi-do (KR); Jin-Ho Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/792,965

(22) Filed: Oct. 25, 2017

(65) Prior Publication Data

US 2018/0337054 A1    Nov. 22, 2018

(30) Foreign Application Priority Data

May 19, 2017 (KR) .................. 10-2017-0061990

(51) Int. Cl.
| | |
|---|---|
| G11C 5/06 | (2006.01) |
| G11C 7/18 | (2006.01) |
| H01L 21/28 | (2006.01) |
| H01L 27/11 | (2006.01) |
| H01L 49/02 | (2006.01) |
| H01L 29/423 | (2006.01) |
| H01L 27/1157 | (2017.01) |
| H01L 27/11519 | (2017.01) |
| H01L 27/11565 | (2017.01) |

(Continued)

(52) U.S. Cl.
CPC ........ H01L 21/28273 (2013.01); G11C 5/063 (2013.01); G11C 7/18 (2013.01); H01L 27/11 (2013.01); H01L 27/1157 (2013.01); H01L 27/11519 (2013.01); H01L 27/11565 (2013.01); H01L 27/11573 (2013.01); H01L 27/11575 (2013.01); H01L 27/11582 (2013.01); H01L 28/75 (2013.01); H01L 28/87 (2013.01); H01L 28/91 (2013.01); H01L 29/42324 (2013.01)

(58) Field of Classification Search
CPC ......... H01L 27/11582; H01L 27/11556; H01L 27/11573; H01L 27/11565; H01L 23/528; H01L 23/5226
See application file for complete search history.

(56) References Cited

U.S. PATENT DOCUMENTS 7,915,667 B2 *  3/2011  Knoefler ........... H01L 21/28273
                                                    257/206
8,541,831 B2 *  9/2013  Chae ................. H01L 27/11578
                                                    257/324

(Continued)

FOREIGN PATENT DOCUMENTS

KR    1020110013701    2/2011

Primary Examiner — Zandra V Smith
Assistant Examiner — John M Parker
(74) Attorney, Agent, or Firm — IP & T Group LLP

(57) ABSTRACT

A semiconductor memory device includes a semiconductor layer including a memory cell region; a memory cell array including a plurality of first gate electrode layers stacked over the semiconductor layer, and disposed in the memory cell region; and a capacitor circuit disposed over the semiconductor layer outside the memory cell region. The capacitor circuit includes a plurality of gate structural bodies each including second gate electrode layers stacked over the semiconductor layer, and arranged along a first direction; a plurality of electrodes disposed between the gate structural bodies; and dielectric layers interposed between the gate structural bodies and the electrodes.

19 Claims, 14 Drawing Sheets

(51) Int. Cl.
*H01L 27/11573* (2017.01)
*H01L 27/11575* (2017.01)
*H01L 27/11582* (2017.01)

(56) References Cited

U.S. PATENT DOCUMENTS

| | | | |
|---|---|---|---|
| 8,791,523 B2 * | 7/2014 | Iino | H01L 27/1157 257/324 |
| 2010/0133599 A1 * | 6/2010 | Chae | H01L 27/11578 257/315 |
| 2013/0242643 A1 * | 9/2013 | Kim | G11C 5/14 365/149 |
| 2015/0340376 A1 * | 11/2015 | Park | H01L 27/11582 257/329 |
| 2017/0053932 A1 | 2/2017 | Jeon | |
| 2017/0338241 A1 * | 11/2017 | Lee | H01L 27/0688 |

* cited by examiner

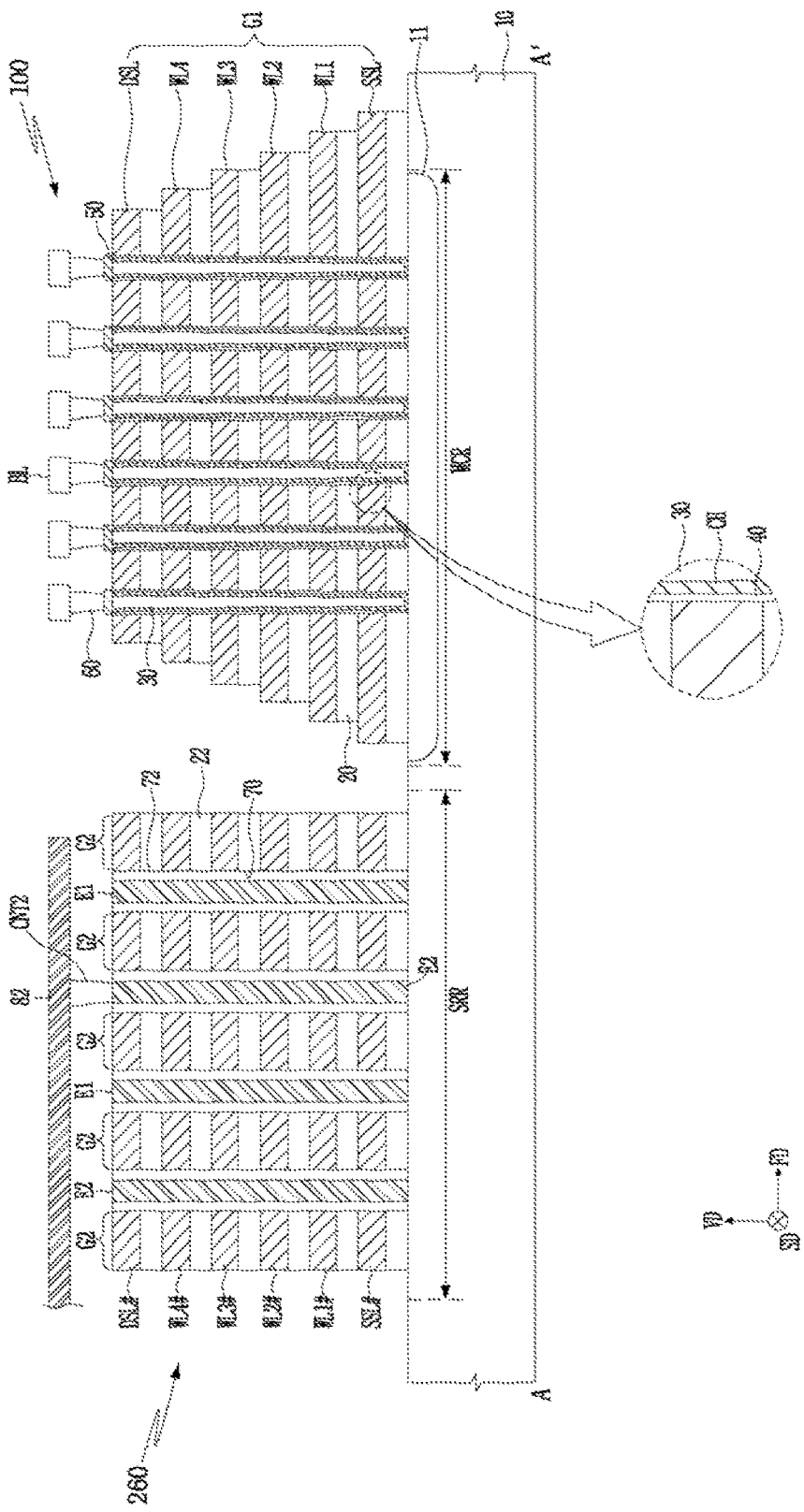

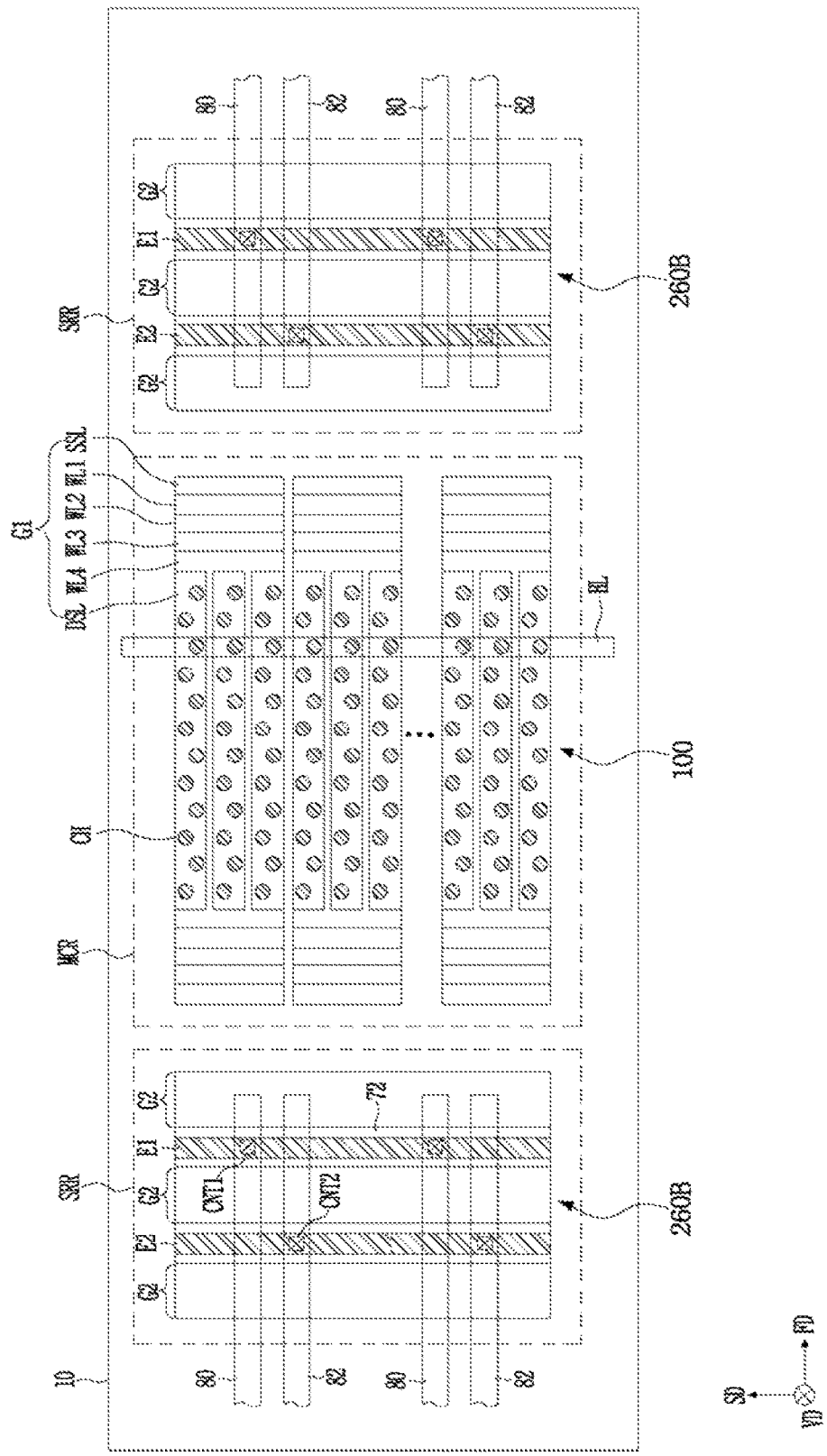

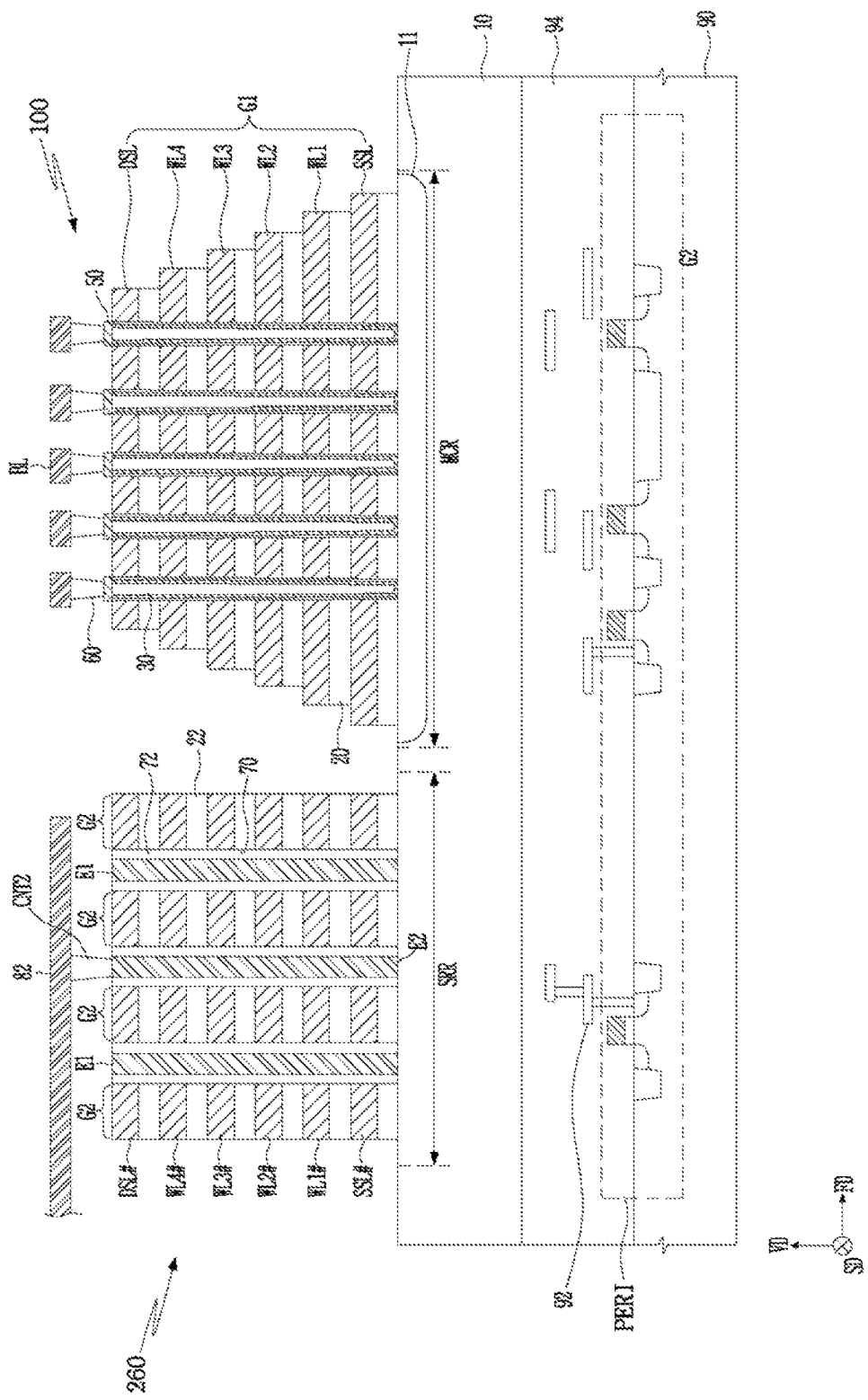

SEMICONDUCTOR MEMORY DEVICE INCLUDING CAPACITORS

CROSS-REFERENCE TO RELATED APPLICATION

The present application claims priority to Korean Patent Application No. 10-2017-0061990 filed on May 19, 2017, which is herein incorporated by reference in its entirety.

BACKGROUND

1. Technical Field

Various embodiments generally relate to a semiconductor memory device, and more particularly, to a semiconductor memory device including capacitors.

2. Related Art

Capacitors are used for an operation of a semiconductor memory device. For example, power decoupling capacitors for retaining a predetermined power supply voltage and pump capacitors for pumping a voltage and thereby generating a voltage at a level higher than the power supply voltage, are being used.

SUMMARY

In an embodiment, a semiconductor memory device may include: a semiconductor layer including a memory cell region; a memory cell array including a plurality of first gate electrode layers stacked over the semiconductor layer, and disposed in the memory cell region; and a capacitor circuit disposed over the semiconductor layer outside the memory cell region. The capacitor circuit may include: a plurality of gate structural bodies each including second gate electrode layers stacked over the semiconductor layer, and arranged in a first direction; a plurality of electrodes disposed between the gate structural bodies; and dielectric layers interposed between the gate structural bodies and the electrodes.

In an embodiment, a semiconductor memory device may include: a peripheral circuit disposed at a first level over a substrate; a memory cell array and a capacitor circuit disposed at a second level over the substrate, The capacitor circuit includes a plurality of gate structural bodies, each including gate electrode layers stacked in a vertical direction perpendicular to the substrate, and arranged in a first direction; a plurality of electrodes disposed in openings between the gate structural bodies; and dielectric layers formed between the gate structural bodies and the electrodes.

In an embodiment, a semiconductor memory device may include: a plurality of gate structural bodies each including gate electrode layers stacked over a semiconductor layer, and arranged in a first direction; a plurality of electrodes disposed between the gate structural bodies; and dielectric layers interposed between the gate structural bodies and the electrodes.

BRIEF DESCRIPTION OF THE DRAWINGS

FIG. 5 is a cross-sectional view taken along the line A-A' of FIG. 4.

FIGS. 6A to 6D are top views illustrating various modifications of the semiconductor memory device shown in FIG. 4.

FIG. 7 is a cross-sectional view illustrating a semiconductor memory device in accordance with an embodiment of the present invention.

DETAILED DESCRIPTION

Hereinafter, a semiconductor memory device including capacitors will be described below with reference to the accompanying drawings through various examples of embodiments.

Figure 1:
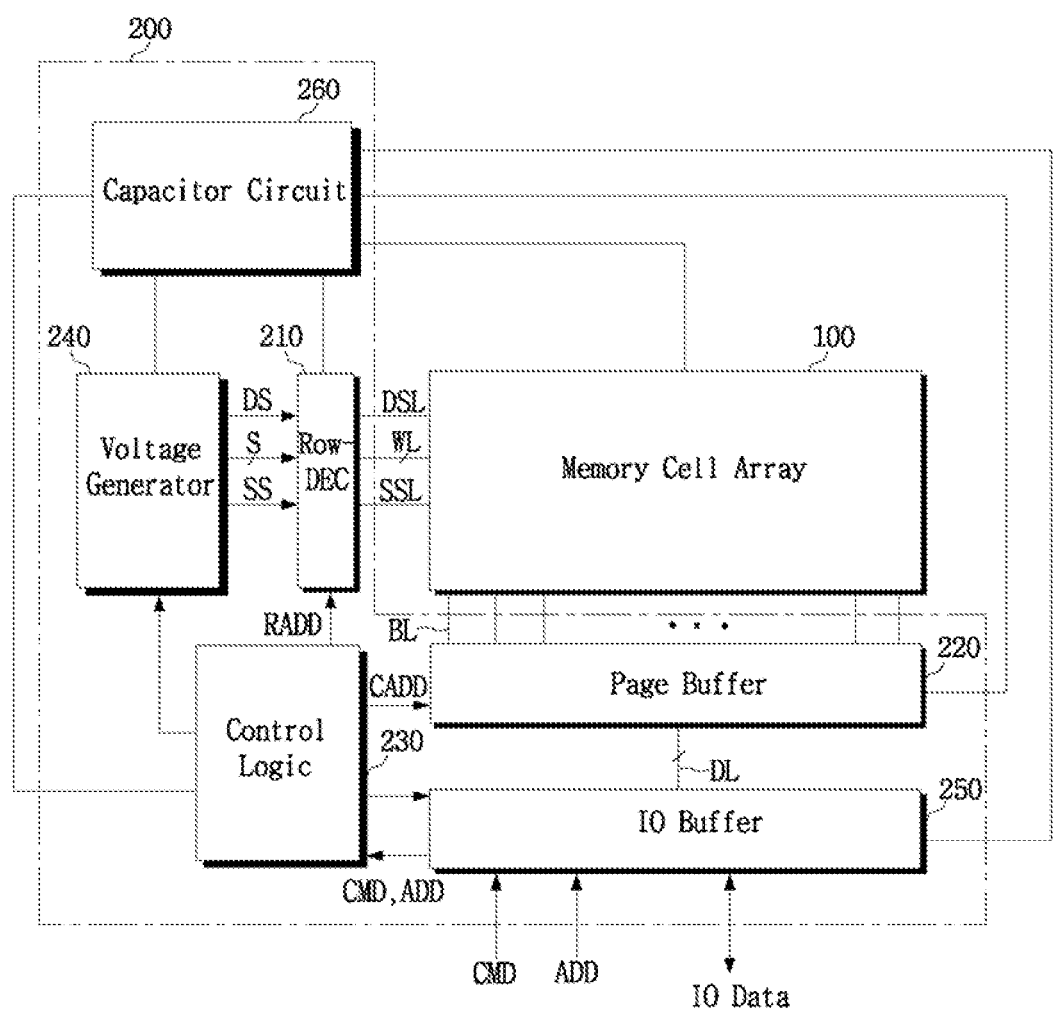
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, the semiconductor memory device in accordance with the embodiment may include a memory cell array 100 and a peripheral circuit 200.

The memory cell array 100 may be electrically coupled to a row decoder 210 which is included in the peripheral circuit 200, through word lines WL and select lines DSL and SSL. The memory cell array 100 may be electrically coupled to a page buffer 220 which is included in the peripheral circuit 200, through bit lines BL.

Figure 2:
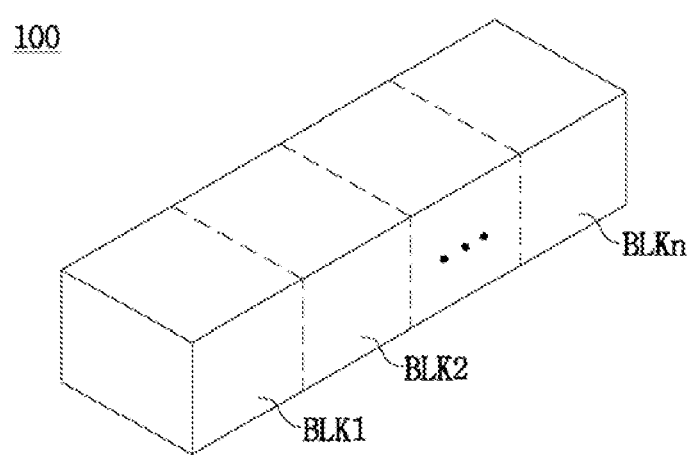
FIG. 2 is a configuration diagram illustrating a memory cell array shown in FIG. 1.

FIG. 2 is a configuration diagram illustrating the memory cell array 100 shown in FIG. 1.

Referring to FIG. 2, the memory cell array 100 may include a plurality of memory blocks BLK1 to BLKn. Each of the memory blocks BLK1 to BLKn may correspond to an erase unit.

The memory blocks BLK1 to BLKn may be configured in the same manner with one another. Each of the memory blocks BLK1 to BLKn may include a plurality of cell strings. A cell string may be the unit of memory cells which are coupled in series. Memory cells included in one cell string may be selected by the same select transistors.

Figure 3:
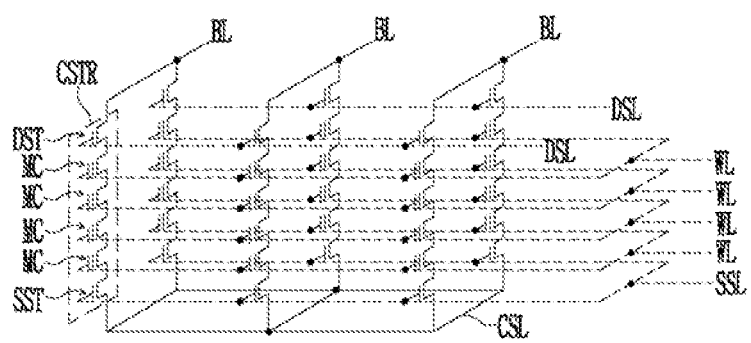
FIG. 3 is an equivalent circuit diagram illustrating one of the memory blocks shown in FIG. 2.

FIG. 3 is an equivalent circuit diagram illustrating one memory block among the memory blocks BLK1 to BLKn shown in FIG. 2.

Since the memory blocks BLK1 to BLKn are configured in the same manner with one another, descriptions will be made for only a first memory block BLK1.

Referring to FIG. 3, the first memory block BLK1 may include a plurality of cell strings CSTR. Each of the cell strings CSTR may be coupled between a bit line BL associated therewith and a common source line CSL. Each of the cell strings CSTR may include a source select transistor SST which is coupled to the common source line CSL, a drain select transistor DST which is coupled to the bit line BL, and a plurality of memory cells MC which are coupled between the source select transistor SST and the drain select transistor DST. The gate of the source select transistor SST may be coupled to a source select line SSL. The gate of the drain select transistor DST may be coupled to a corresponding drain select line DSL. The gates of the memory cells MC may be coupled to corresponding word lines WL, respectively.

A set of memory cells which are coupled to the same word line and are programmed simultaneously is referred to as a page. The first memory block BLK1 may be configured by a plurality of pages. Also, a plurality of pages may be coupled to each word line. In the embodiment illustrated in FIG. 3, each word line is coupled in common to two pages.

Referring again to FIG. 1, the peripheral circuit 200 may include the row decoder 210, the page buffer 220, a control logic 230, a voltage generator 240, an input/output buffer 250, and a capacitor circuit 260.

The row decoder 210 may be coupled to the memory cell array 100 through the word lines WL and the select lines DSL and SSL. The row decoder 210 may be configured to operate in response to control of the control logic 230. The row decoder 210 may receive a row address RADD from the control logic 230.

The row decoder 210 may be configured to decode the received row address RADD. The row decoder 210 may select any one among the memory blocks included in the memory cell array 100, in response to the decoded row address RADD. The row decoder 210 may select one word line of a selected memory block, by applying an operating voltage provided from the voltage generator 240, in response to the decoded row address RADD.

The page buffer 220 may be coupled to the memory cell array 100 through the bit lines BL. The page buffer 220 may operate as a write driver or a sense amplifier depending on an operation mode. In a program operation, the page buffer 220 may transfer voltages corresponding to data to be programmed, to the bit lines BL of the memory cell array 100. In a read operation, the page buffer 220 may sense data stored in selected memory cells, through bit lines BL, and transfer the sensed data to the input/output buffer 250. In an erase operation, the page buffer 220 may float the bit lines BL of the memory cell array 100.

The control logic 230 may be coupled to the row decoder 210, the page buffer 220, the voltage generator 240 and the input/output buffer 250. The control logic 230 may receive a command CMD and an address ADD through the input/output buffer 250 from a controller (not shown). The control logic 230 may be configured to control the row decoder 210, the page buffer 220, the voltage generator 240 and the input/output buffer 250 in response to the command CMD. The control logic 230 may output the row address RADD and a column address CADD in response to the address ADD inputted through the input/output buffer 250.

The voltage generator 240 may be configured to generate various types of word line voltages S to be supplied to the respective word lines WL and voltages to be supplied to a bulk, for example, a well region, in which memory cells are formed, according to control of the control logic 230. The word line voltages S to be supplied to the respective word lines WL may include a program voltage (Vpgm), a pass voltage (Vpass), and select and unselect read voltages (Vrd and Vread). The voltage generator 240 may generate select signals DS and SS which are to be provided to the select lines DSL and SSL. The select signal DS is a control signal for selecting a cell string, and the select signal SS is a ground select signal.

The input/output buffer 250 may be coupled to the page buffer 220 through data lines DL. The input/output buffer 250 may operate in response to control of the control logic 230. In the program operation, the input/output buffer 250 may transfer write data inputted from an external device (not shown), to the page buffer 220. In the read operation, the input/output buffer 250 may output data provided from the page buffer 220, to the external device.

The capacitor circuit 260 may be coupled to the memory cell array 100. The capacitor circuit 260 may be coupled to the components included in the peripheral circuit 200, that is, the row decoder 210, the page buffer 220, the control logic 230, the voltage generator 240 and the input/output buffer 250.

The capacitor circuit 260 may include a plurality of capacitors. The capacitors may include power decoupling capacitors, pump capacitors, etc. The power decoupling capacitors may serve to reduce power noise when a power supply voltage (VCC) necessary for the operation of the semiconductor memory device is supplied. The power decoupling capacitors may suppress an abrupt change of the power supply voltage (VCC) and thus prevent the malfunction of a chip. The pump capacitors may pump a voltage and generate a voltage of a level higher than the power supply voltage (VCC).

As the size of a semiconductor memory device decreases and the degree of integration is enhanced, a substrate area for the capacitor circuit 260 is gradually decreasing, whereas the magnitude of a required capacitance is gradually increasing. As a consequence, it becomes difficult to secure a capacitance. Embodiments of the present disclosure may provide a semiconductor memory device capable of securing a high capacitance within a limited area.

Figure 4:
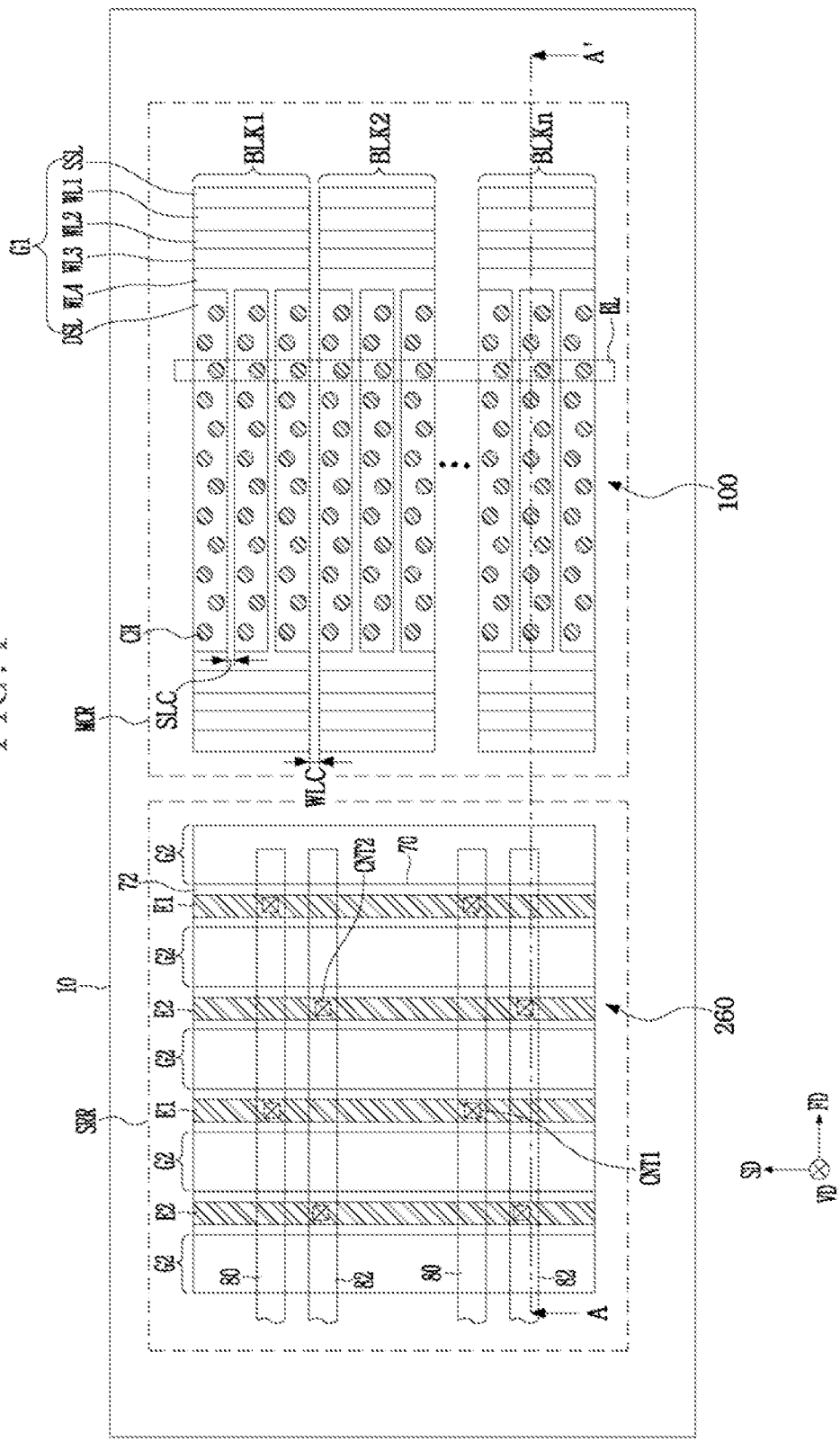
FIG. 4 is a top view illustrating a semiconductor memory device in accordance with an embodiment of the present invention.

FIG. 4 is a top view illustrating a semiconductor memory device in accordance with an embodiment of the present invention, and FIG. 5 is a cross-sectional view taken along the line A-A' of FIG. 4. In FIG. 4, the memory cell array 100 and the capacitor circuit 260 of FIG. 1 are shown as an example.

Referring to FIGS. 4 and 5, the memory cell array 100 and the capacitor circuit 260 may be disposed on a semiconductor layer 10.

The semiconductor layer 10 may have a main surface which extends in a first direction FD and a second direction SD. The second direction SD indicates a direction intersecting the first direction FD. In the embodiment shown in FIGS. 4 and 5, the second direction SD indicates a direction perpendicular to the first direction FD. The semiconductor layer 10 may include a polysilicon which is doped with an impurity. The semiconductor layer 10 may include silicon (Si), germanium (Ge) or silicon-germanium (SiGe). The semiconductor layer 10 may include a polysilicon substrate, a silicon-on-insulator (SOI) substrate or a germanium-on-insulator (GeOI) substrate. A well region 11 may be formed in the semiconductor layer 10. The well region 11 may include a P-type well which is doped with a P-type impurity. The well region 11 may include an N-type well. The well region 11 may be embodied as a P-type well and an N-type well which overlap with each other.

The semiconductor layer 10 may include a memory cell region MCR and a surrounding region SRR. The memory cell region MCR may be a region where the memory cell array 100 is formed. The surrounding region SRR may be a region which is adjacent to at least one side surface among four side surfaces of the memory cell region MCR, and may be disposed side by side with the memory cell region MCR.

The memory cell array 100 may be formed in the memory cell region MCR, and the capacitor circuit 260 may be formed in the surrounding region SRR. In the present embodiment, the memory cell array 100 and the capacitor circuit 260 may be disposed in the first direction FD.

The memory cell array 100 may include a first gate structural body G1 and a plurality of channel layers CH.

The first gate structural body G1 may include a plurality of first gate electrode layers SSL, WL1 to WL4 and DSL. The first gate electrode layers SSL, WL1 to WL4 and DSL may be stacked on the semiconductor layer 10. The first gate electrode layers SSL, WL1 to WL4 and DSL may include a source select line SSL, word lines WL1 to WL4 and a drain select line DSL. The source select line SSL, the word lines WL1 to WL4 and the drain select line DSL may be disposed sequentially in a vertical direction VD. The vertical direction VD indicates a stack direction orthogonal to the main surface of the semiconductor layer 10. Dielectric layers 20 may be disposed on and under the respective first gate electrode layers SSL, WL1 to WL4 and DSL.

The first gate electrode layers SSL, WL1 to WL4 and DSL may be divided into memory block units by word line cut regions WLC which extend in the first direction FD. Memory blocks BLK1 to BLKn may be separated from one another with the word line cut regions WLC interposed therebetween. The memory blocks BLK1 to BLKn may extend in the first direction FD, and be arranged in the second direction SD intersecting the first direction FD. Among the first gate electrode layers SSL, WL1 to WL4 and DSL, the drain select line DSL may be divided by select line cut regions SLC which extend in the first direction FD.

Since the areas of the first gate electrode layers SSL, WL1 to WL4 and DSL may be reduced as a distance from the semiconductor layer 10 increases, and an edge region of the first gate structural body G1 may have a step shape in the first direction FD as illustrated in FIGS. 4 and 5. While not shown, a plurality of contacts may be formed in the edge region of the first gate structural body G1. The first gate electrode layers SSL, WL1 to WL4 and DSL may be coupled with wiring lines through the contacts, and be provided with electrical signals from a peripheral circuit, for example, the row decoder 210 (see FIG. 1).

While it is illustrated in the embodiment of FIGS. 4 and 5 that four word lines are stacked, it is to be noted that the stack number of word lines is not limited thereto. For example, 8, 16, 32 or 64 word lines may be stacked in the vertical direction VD between the source select line SSL and the drain select line DSL. While it is illustrated in the embodiment of FIGS. 4 and 5 that one source select line SSL and one drain select line DSL are disposed in the vertical direction VD, it is to be noted that at least two source select lines or at least two drain select lines may be disposed in the vertical direction VD.

The channel layers CH may pass through the first gate electrode layers SSL, WL1 to WL4 and DSL and the dielectric layers 20 in the vertical direction VD. The bottom surfaces of the channel layers CH may be brought into contact with the top surface of the semiconductor layer 10. The channel layers CH may be arranged to be separated from one another by a predetermined spacing in the first direction FD and the second direction SD. The channel layers CH may include a polysilicon which is doped with an impurity. The channel layers CH may include a polysilicon which is not doped with an impurity. Each of the channel layers CH may have a tube shape in which a bottom is closed and a center region is opened, and a buried dielectric layer 30 may be filled in the opened center region of each channel layer CH. In an embodiment, each of the channel layers CH may have a pillar shape in which center region is not opened, and, in this case, the buried dielectric layer 30 may be omitted.

Source select transistors may be formed at intersections of the source select line SSL and the channel layers CH. Memory cells may be formed at intersections of the word lines WL1 to WL4 and the channel layers CH. Drain select transistors may be formed at intersections of the drain select line DSL and the channel layers CH. By such a structure, cell strings may be configured as the source select transistors, the plurality of memory cells and the drain select transistors are coupled in series by the channel layers CH.

A gate dielectric layer 40 which surrounds the outer walls of the channel layers CH may be formed between the first gate electrode layers SSL, WL1 to WL4 and DSL and the channel layers CH. The gate dielectric layer 40 may include a tunnel dielectric layer, a charge storage layer, and a blocking dielectric layer. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking dielectric layer may include a single layer or a stacked layer of a silicon oxide, a silicon nitride, a hafnium oxide, an aluminum oxide, a zirconium oxide and a tantalum oxide.

Pads 50 may be formed on the channel layers CH, the buried dielectric layer 30 and the gate dielectric layer 40. The pads 50 may include a polysilicon or a single crystalline silicon, and further include an N-type impurity such as phosphor (P) and arsenic (As). Bit line contacts 60 may be formed on the pads 50, respectively. Bit lines BL may be formed on the bit line contacts 60. The bit lines BL may extend in the second direction SD. A plurality of channel layers CH which are arranged in the second direction SD may be coupled to a single bit line BL. While only one bit line BL is illustrated in FIG. 4 for the sake of simplification in illustration, it is to be understood that a plurality of bit lines BL are arranged in the first direction FD.

The capacitor circuit 260 may be formed outside the memory cell region MCR. The capacitor circuit 260 may be disposed in the surrounding region SRR which is positioned on one side of the memory cell region MCR when viewed in the first direction FD. The capacitor circuit 260 may be disposed side by side with the memory cell array 100 when viewed in the first direction FD. The capacitor circuit 260 may include a plurality of second gate structural bodies G2, a plurality of electrodes E1 and E2, and a dielectric layer 72.

The second gate structural bodies G2 may be arranged in the same direction as the extending direction of the memory blocks BLK1 to BLKn. For example, the memory blocks BLK1 to BLKn may extend in the first direction FD, and the second gate structural bodies G2 may be arranged in the first direction FD. Each of the second gate structural bodies G2 may have a line shape which extends in the second direction SD intersecting the first direction FD.

Each of the second gate structural bodies G2 may include a plurality of second gate electrode layers SSL#, WL1# to WL4# and DSL# which are stacked on the semiconductor layer 10 in the surrounding region SRR. The second gate electrode layers SSL#, WL1# to WL4# and DSL# may be sequentially disposed on the semiconductor layer 10 in the vertical direction VD. Dielectric layers 22 may be disposed on and under the respective second gate electrode layers SSL#, WL1# to WL4# and DSL#.

The number of the second gate electrode layers SSL#, WL1# to WL4# and DSL# Included in each of the second gate structural bodies G2 may be substantially the same as the number of the first gate electrode layers SSL, WL1 to WL4 and DSL included in the first gate structural body G1.

The second gate electrode layers SSL#, WL1# to WL4# and DSL# may be disposed at the same layers as the first gate electrode layers SSL, WL1 to WL4 and DSL, respectively. The first gate electrode layers SSL, WL1 to WL4 and DSL and the second gate electrode layers SSL#, WL1# to WL4# and DSL# which are disposed at the same layers may be formed through the same processing steps. For example, the first gate electrode layer WL1 and the second gate electrode layer WL1# may be formed through the same processing step. Due to this fact, the heights and materials of a first gate electrode layer and a second gate electrode layer which are disposed at the same layer may be the same as each other.

The side surfaces of the second gate electrode layers SSL#, WL1# to WL4# and DSL# which are included in each of the second gate structural bodies G2 may be aligned with one another. According to this fact, the side surfaces of the second gate structural bodies G2 may have a vertical contour.

Openings 70 may be formed between the second gate structural bodies G2. The openings 70 may extend in the same direction as the extending direction of the second gate structural bodies G2, that is, the second direction SD. The openings 70 may expose the semiconductor layer 10.

The electrodes E1 and E2 may be disposed in the openings 70. Each of the electrodes E1 and E2 may have a line shape which extends in the second direction SD. Each of the electrodes E1 and E2 may include any one selected between a titanium layer and a titanium nitride layer.

The electrodes E1 and E2 may be formed to face the side surfaces of the second gate electrode layers SSL#, WL1# to WL4# and DSL# which are included in the second gate structural bodies G2. The electrodes E1 and E2 may extend in the vertical direction VD from the surface of the semiconductor layer 10. The electrodes E1 and E2 may have a height higher than or equal to a height of the second gate structural bodies G2 in the vertical direction VD.

The electrodes E1 and E2 may include one or more first electrodes E1 and one or more second electrodes E2. In the present embodiment, a case in which two first electrodes E1 and two second electrodes E2 are included is illustrated as an example. The first electrodes E1 and the second electrodes E2 may be disposed alternately in the first direction FD. Predetermined voltages may be applied to the first and second electrodes E1 and E2. A voltage applied to the second electrodes E2 may have a level lower than a voltage applied to the first electrodes E1. For example, a power supply voltage (VCC) may be applied to the first electrodes E1, and a ground voltage (VSS) may be applied to the second electrodes E2.

A dielectric layer 72 may be interposed between the second gate structural bodies G2 and the first and second electrodes E1 and E2. The first and second electrodes E1 and E2 may be insulated from the second gate structural bodies G2 by the dielectric layer 72. The dielectric layer 72 may include a high-k material. The high-k material may be formed as a single layer of any one selected among a hafnium oxide ($HfO_2$), a zirconium oxide ($ZrO_2$), a titanium oxide ($TiO_2$), a tantalum oxide ($TA_2O_5$) and a strontium titanium oxide (STO($SrTiO_3$)) or a stack layer thereof. For instance, the dielectric layer 72 may include a zirconium oxide ($ZrO_2$).

One or more first contacts CNT1 may be formed on the respective first electrodes E1. First wiring lines 80 may be formed on the first contacts CNT1. The first wiring lines 80 may intersect with the first electrodes E1. For example, the first wiring lines 80 may extend in the first direction FD intersecting the second direction SD as the extending direction of the first electrodes E1. The first wiring lines 80 may be electrically coupled to the first electrodes E1 through the first contacts CNT1. The first wiring lines 80 may transfer the predetermined voltage to the first electrodes E1 through the first contacts CNT1. For example, the first wiring lines 80 may be electrically coupled to the voltage generator 240 shown in FIG. 1, be provided with the power supply voltage (VCC) from the voltage generator 240, and transfer the power supply voltage (VCC) provided from the voltage generator 240, to the first electrodes E1 through the first contacts CNT1.

One or more second contacts CNT2 may be formed on the respective second electrodes E2. Second wiring lines 82 may be formed on the second contacts CNT2. The second wiring lines 82 may intersect with the second electrodes E2. For example, the second wiring lines 82 may extend in the first direction FD intersecting the second direction SD as the extending direction of the second electrodes E2. The second wiring lines 82 may be electrically coupled to the second electrodes E2 through the second contacts CNT2. The second wiring lines 82 may transfer the predetermined voltage to the second electrodes E2 through the second contacts CNT2. For example, the second wiring lines 82 may be electrically coupled to the voltage generator 240 shown in FIG. 1, be provided with the ground voltage (VSS) from the voltage generator 240, and transfer the ground voltage (VSS) provided from the voltage generator 240, to the second electrodes E2 through the second contacts CNT2.

FIGS. 6A to 6D are top views illustrating various modifications of the semiconductor memory device of FIG. 4.

In the following embodiments to be described with reference to FIGS. 6A to 6D, the same technical terms and the same reference numerals will be used to refer to substantially the same components as the components of the embodiment described above with reference to FIGS. 4 and 5, and repeated descriptions will be omitted herein.

Figure 6A:
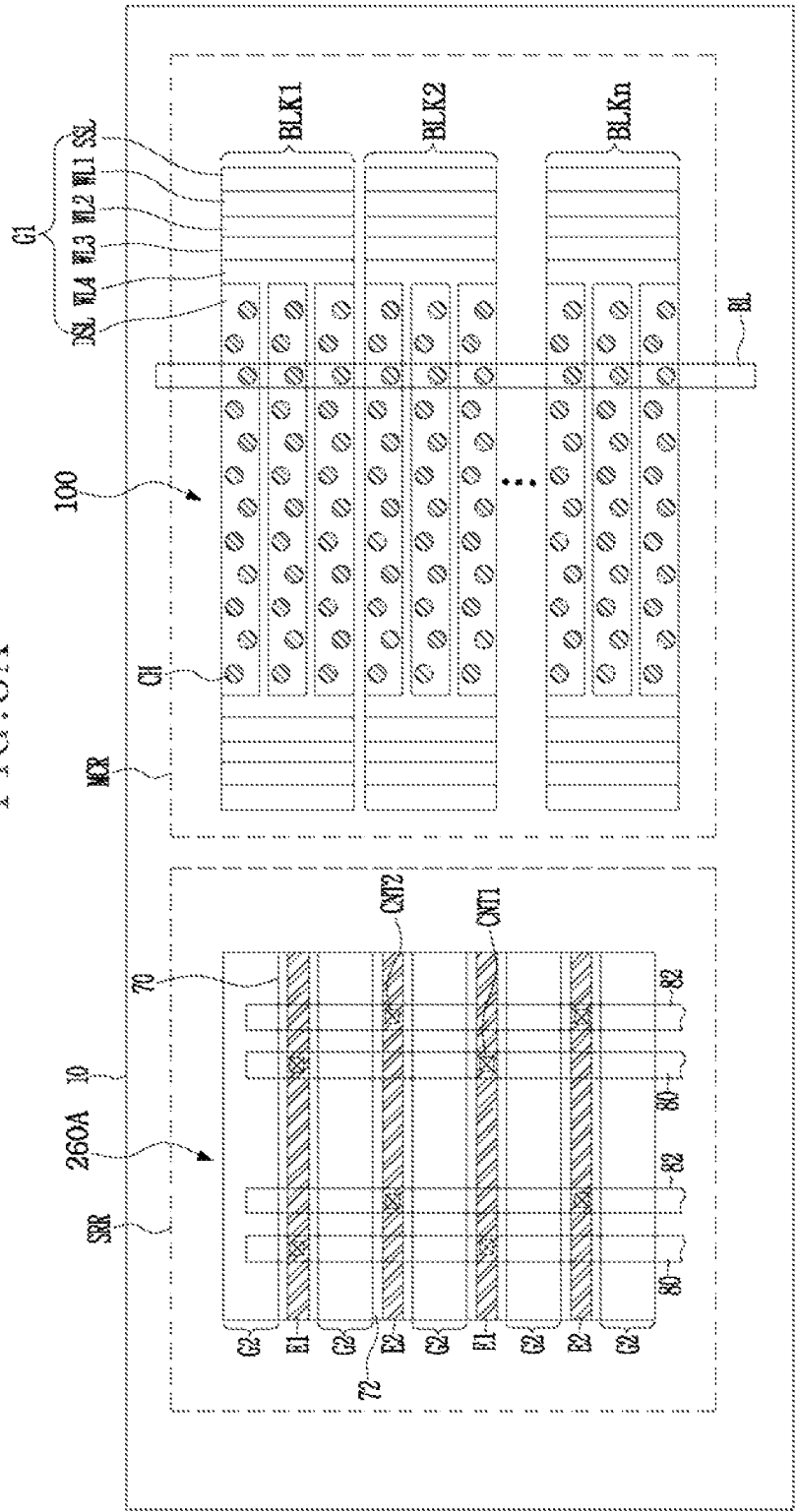

Referring to FIG. 6A, a capacitor circuit 260A is disposed side by side with a memory cell array 100 in a surrounding region SRR which is positioned on one side of a memory cell region MCR when viewed in a second direction SD. The capacitor circuit 260A may include a plurality of second gate structural bodies G2, first electrodes E1, second electrodes E2 and a dielectric layer 72 which are disposed on a semiconductor layer 10 in the surrounding region SRR.

The second gate structural bodies G2 may be arranged in a direction intersecting the extending direction of memory blocks BLK1 to BLKn. For example, the memory blocks BLK1 to BLKn may extend in the second direction SD, and the second gate structural bodies G2 may be arranged in a first direction FD intersecting the second direction SD. Each of the second gate structural bodies G2 may have a line shape which extends in the second direction SD. Openings 70 may be formed between the second gate structural bodies G2. The openings 70 may extend in the second direction SD. The first electrodes E1 or the second electrodes E2 may be disposed in the respective openings 70. The first electrodes E1 and the second electrodes E2 may extend in the second direction SD, and be disposed alternately in the first direction FD.

A dielectric layer 72 may be interposed between the second gate structural bodies G2 and the first and second electrodes E1 and E2. The first and second electrodes E1 and E2 may be insulated from the second gate structural bodies G2 by the dielectric layer 72.

One or more first contacts CNT1 may be formed on the respective first electrodes E1. First wiring lines 80 may be formed on the first contacts CNT1. The first wiring lines 80 may intersect with the first electrodes E1. For example, the first wiring lines 80 may extend in the first direction FD intersecting the second direction SD as the extending direction of the first electrodes E1. The first wiring lines 80 may be electrically coupled to the first electrodes E1 through the first contacts CNT1.

One or more second contacts CNT2 may be formed on the respective second electrodes E2. Second wiring lines 82 may be formed on the second contacts CNT2. The second wiring lines 82 may intersect with the second electrodes E2. For example, the second wiring lines 82 may extend in the first direction FD intersecting the second direction SD as the extending direction of the second electrodes E2. The second wiring lines 82 may be electrically coupled to the second electrodes E2 through the second contacts CNT2.

Referring to FIG. 6B, capacitor circuits 260B may be disposed on both sides of a memory cell region MCR when viewed in a first direction FD. The capacitor circuits 260B may be disposed by being distributed in two surrounding regions SRR which are positioned on both sides of the memory cell region MCR when viewed in the first direction FD.

Figure 6C:
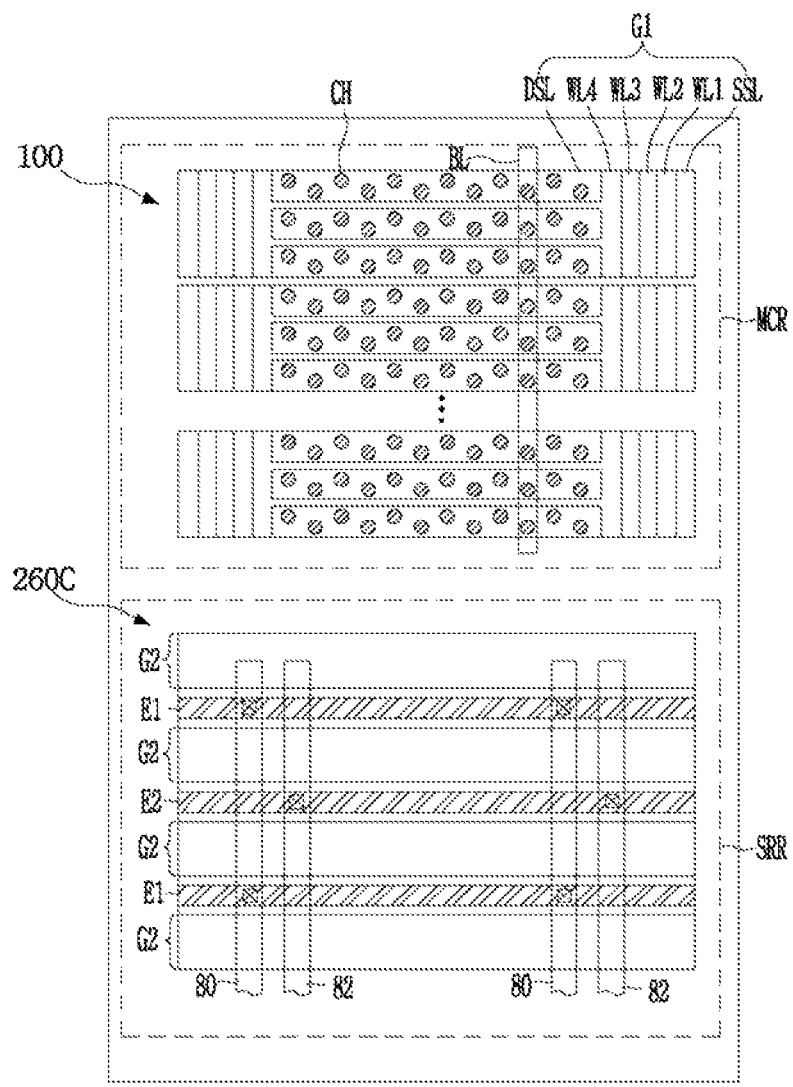

Referring to FIG. 6C, a capacitor circuit 260C may be disposed side by side with a memory cell array 100 on one side of a memory cell region MCR when viewed in a first direction FD.

Second gate structural bodies G2 of the capacitor circuit 260C may extend in the same direction as the extending direction of memory blocks BLK1 to BLKn. For example, the memory blocks BLK1 to BLKn may extend in a second direction SD, and the second gate structural bodies G2 may be extend in the second direction SD. The length of the second gate structural bodies G2 in the second direction SD may be substantially the same as the length of first gate structural bodies G1 included in the memory cell array 100.

Figure 6D:
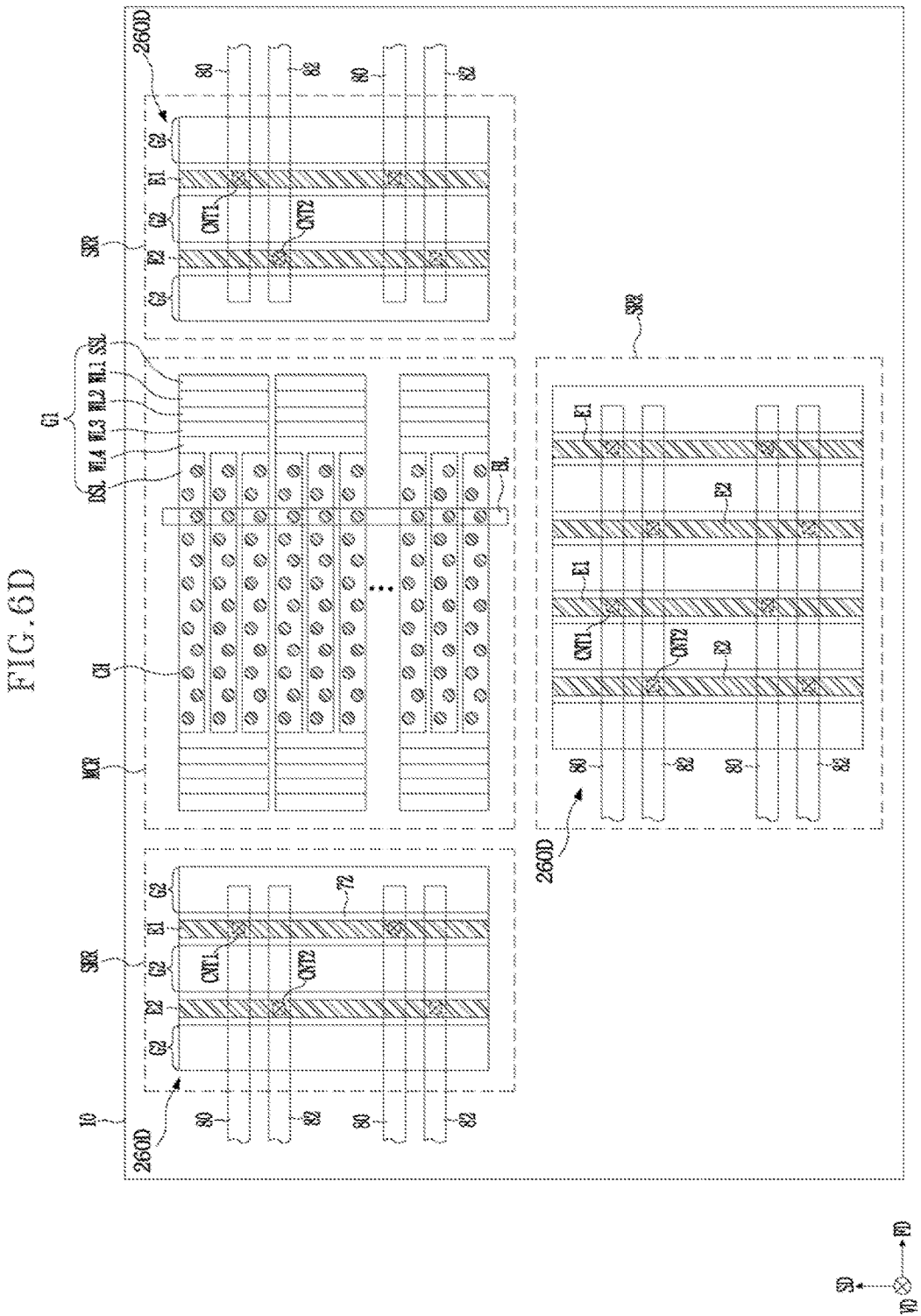

While it is illustrated in the embodiments described above with reference to FIGS. 4 to 6C that the capacitor circuits 260, 260A, 260B and 260C are disposed side by side with the memory cell array 100 in only any one direction of the first direction FD and the second direction SD, it is to be noted that the disclosure is not limited thereto. For example, as shown in FIG. 6D, capacitor circuits 260D may be disposed side by side with a memory cell array 100 when viewed in a first direction FD and a second direction SD.

FIG. 7 is a cross-sectional view illustrating a semiconductor memory device in accordance with an embodiment of the present invention. FIG. 7 is a view schematically illustrating another example of a cross-sectional view taken in correspondence to the line A-A' of FIG. 4. The layout of the semiconductor memory device in accordance with the present embodiment is the same as that illustrated in FIG. 4. Therefore, descriptions made above with reference to FIG. 4 may be applied to the present embodiment as well.

Referring to FIG. 7, a peripheral circuit PERI may be disposed at a first level on a substrate 90, and a memory cell array 100 and a capacitor circuit 260 may be disposed over the peripheral circuit PERI, that is, at a second level on the substrate 90. As used herein, the term "level" means a height from the substrate 90 in a vertical direction VD. The substrate 90 may have a main surface which extends in a first direction FD and a second direction SD. The vertical direction VD indicates a direction orthogonal to the main surface of the semiconductor layer 10. On the substrate 90, the first level may be closer to the substrate 90 than the second level in a vertical direction VD.

At least a portion of the peripheral circuit PERI may overlap with the memory cell array 100 and the capacitor circuit 260 in the vertical direction VD. According to the present embodiment, since the peripheral circuit PERI is disposed to vertically overlap with the memory cell array 100 and the capacitor circuit 260, the area of the substrate 90 may be utilized to the maximum, whereby the size of the semiconductor memory device may be reduced.

The semiconductor memory device may include the peripheral circuit PERI which is formed at the first level on the substrate 90, a semiconductor layer 10 which is formed over the peripheral circuit PERI, and the memory cell array 100 and the capacitor circuit 260 which are formed at the second level on the substrate 90. The semiconductor memory device may further include a wiring layer 92 which configures a wiring structure of the peripheral circuit PERI, and a dielectric layer 94 which covers the peripheral circuit PERI and the wiring layer 92.

The substrate 90 may include Si, Ge or SiGe. The substrate 90 may include a polysilicon substrate, an SOI substrate or a GeOI substrate.

The peripheral circuit PERI may be formed on the substrate 90. The peripheral circuit PERI may include a row decoder 210 shown in FIG. 1, a page buffer 220 shown in FIG. 1, a control logic 230 shown in FIG. 1, a voltage generator 240 shown in FIG. 1, an input/output buffer 250 shown in FIG. 1, and so forth.

The wiring layer 92 which configures the wiring structure of the peripheral circuit PERI may be formed over the peripheral circuit PERI, and the dielectric layer 94 may be formed on the peripheral circuit PERI and the wiring layer 92 to cover the peripheral circuit PERI and the wiring layer 92.

The semiconductor layer 10 may be disposed on the dielectric layer 94. The semiconductor layer 10 may serve as a base layer of the memory cell array 100 and the capacitor circuit 260 which are formed at the second level. The semiconductor layer 10 may include a polysilicon. A well region 11 may be formed in the semiconductor layer 10. The well region 11 may include a P-type well which is doped with a P-type impurity. The well region 11 may include an N-type well. The well region 11 may be embodied as a P-type well and an N-type well which overlap with each other.

As described above with reference to FIGS. 4 and 5, the semiconductor layer 10 may include a memory cell region MCR and a surrounding region SRR. The memory cell region MCR is a region where the memory cell array 100 is disposed. In the memory cell region MCR, there may be disposed a first gate structural body G1 and a plurality of channel layers CH which configure the memory cell array 100. The surrounding region SRR is a region where the capacitor circuit 260 is disposed. In the surrounding region SRR, there may be disposed a plurality of second gate structural bodies G2, first electrodes E1, second electrodes E2 and a dielectric layer 72 which configure the capacitor circuit 260.

Figure 8:
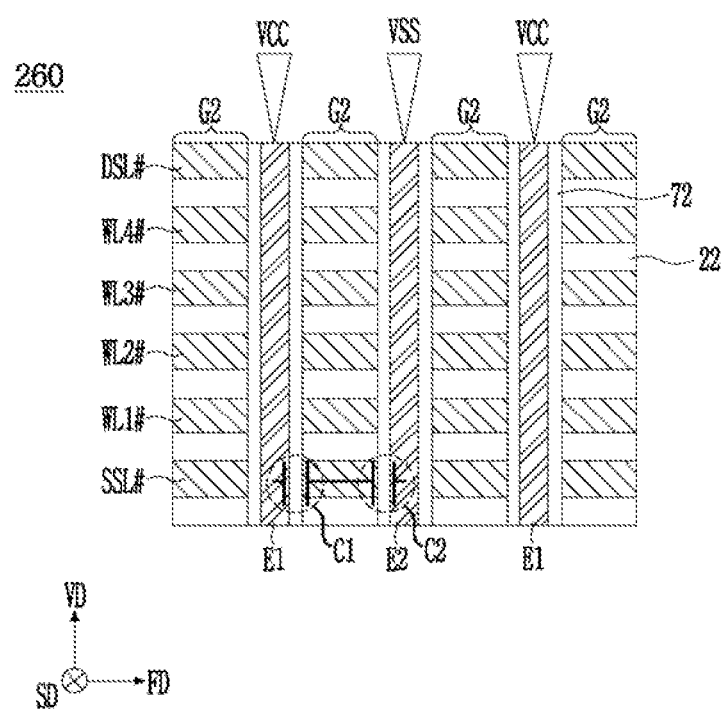
FIG. 8 is a cross-sectional view illustrating a capacitor circuit in accordance with an embodiment of the present invention.
Figure 9:
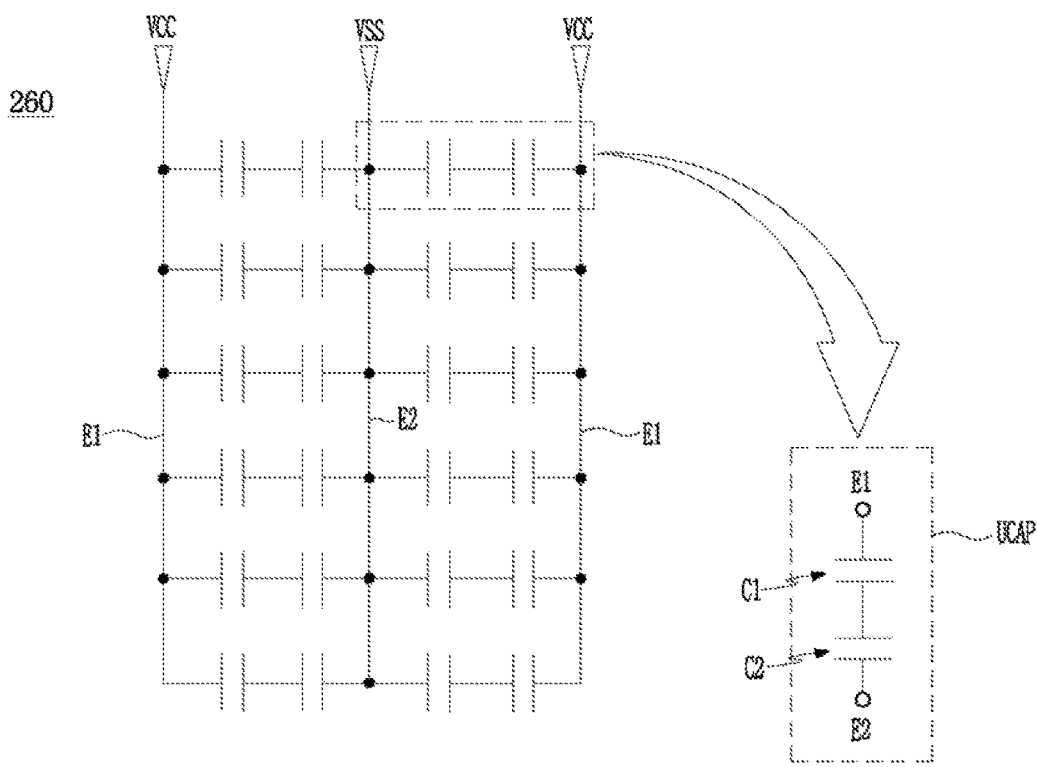
FIG. 9 is an equivalent circuit diagram illustrating the capacitor circuit of FIG. 8.

FIG. 8 is a cross-sectional view illustrating a capacitor circuit 260 in accordance with an embodiment of the present invention, and FIG. 9 is an equivalent circuit diagram illustrating the capacitor circuit 260 of FIG. 8.

Referring to FIG. 8, a plurality of second gate structural bodies G2 each of which includes a plurality of second gate electrode layers SSL#, WL1# to WL4# and DSL# stacked vertically, are arranged in a first direction FD, and first electrodes E1 and a second electrode E2 are disposed alternately between the second gate structural bodies G2. A dielectric layer 72 is formed between the second gate structural bodies G2 and the first electrodes E1 and between the second gate structural bodies G2 and the second electrode E2.

Referring to FIGS. 8 and 9, predetermined voltages may be applied to the first electrodes E1 and the second electrode E2. For example, a power supply voltage VCC may be applied to the first electrodes E1, and a ground voltage VSS may be applied to the second electrode E2. In this case, the potential of the second gate electrode layers SSL#, WL1# to WL4# and DSL# of the second gate structural bodies G2 is changed to VCC/2 in a floating state. Due to this fact, a potential difference of VCC/2 occurs between the second gate electrode layers SSL#, WL1# to WL4# and DSL# of the respective second gate structural bodies G2 and the adjacent first electrodes E1, and a potential difference of VCC/2 occurs between the second gate electrode layers SSL#, WL1# to WL4# and DSL# of the respective second gate structural bodies G2 and the adjacent second electrode E2.

Due to such a potential difference, the second gate electrode layers SSL#, WL1# to WL4# and DSL# of the respective second gate structural bodies G2, the first electrodes E1 adjacent thereto and the dielectric layer 72 formed between the second gate structural bodies G2 and the first electrodes E1 serve as first capacitors C1. Also, the second gate electrode layers SSL#, WL1# to WL4# and DSL# of the respective second gate structural bodies G2, the second electrode E2 adjacent thereto and the dielectric layer 72 formed between the second gate structural bodies G2 and the second electrode E2 serve as second capacitors C2.

since each of the second gate electrode layers SSL#, WL1# to WL4# and DSL# of the second gate structural bodies G2 serves as one electrode of the first capacitor C1 and one electrode of the second capacitor C2, the one electrode of the first capacitor C1 may be electrically coupled to the one electrode of the second capacitor C2. As a result, a plurality of unit capacitor structures UCAP in each of which the first capacitor C1 and the second capacitor C2 are coupled in series are formed. The unit capacitor structures UCAP are coupled in parallel, by the stack number of the second gate electrode layers SSL#, WL1# to WL4# and DSL# included in each second gate structural body G2, between the first electrode E1 and the second electrode E2 which are disposed adjacent to each other with one second gate structural body G2 interposed therebetween.

Since the stack number of the second gate electrode layers SSL#, WL1# to WL4# and DSL# Included in the second gate structural body G2 which is disposed between the second electrode E2 and the first electrode E1 positioned at the left side thereof is 6, six unit capacitor structures UCAP are coupled in parallel between the second electrode E2 and the first electrode E1 positioned at the left side thereof. Similarly, since the stack number of the second gate electrode layers SSL#, WL1# to WL4# and DSL# included in the second gate structural body G2 which is disposed between the second electrode E2 and the first electrode E1 positioned at the right side thereof is 6, six unit capacitor structures UCAP are coupled in parallel between the second electrode E2 and the first electrode E1 positioned at the right side thereof.

As an example, the capacitance values of the first capacitor C1 and the second capacitor C2 are the same as C. Since the unit capacitor structure UCAP is configured as the first capacitor C1 and the second capacitor C2 are coupled in series, the capacitance of the unit capacitor structure UCAP becomes C/2. As shown in FIG. 9, since 12 unit capacitor structures UCAP are coupled in parallel between the first electrodes E1 and the second electrode E2, the capacitance of the capacitor circuit 260 becomes C/2×12, that is, 6C.

As can be readily seen from the above descriptions, the capacitance of the capacitor circuit 260 in accordance with the present embodiment is proportional to the number of the unit capacitor structures UCAP, and the number of the unit capacitor structures UCAP included in the capacitor circuit 260 is proportional to the stack number of the second gate electrode layers included the second gate structural bodies G2.

The stack number of the second gate electrode layers included in the second gate structural bodies G2 is substantially the same as the stack number of the first gate electrode layers included in the memory cell array 100. As is generally known in the art, in order to improve the degree of integration, the stack number of the first gate electrode layers included in the memory cell array 100 should be increased. If the stack number of the first gate electrode layers included in the memory cell array 100 is increased, since the stack number of the second gate electrode layers included in the second gate structural bodies G2 increases as well, it is possible to improve the capacitance of the capacitor circuit 260. In summary, according to the embodiments of the present disclosure, it is possible to provide the capacitor circuit 260 which has a capacitance increased in proportional to an increase in the degree of integration of the memory cell array 100.

Figure 10:
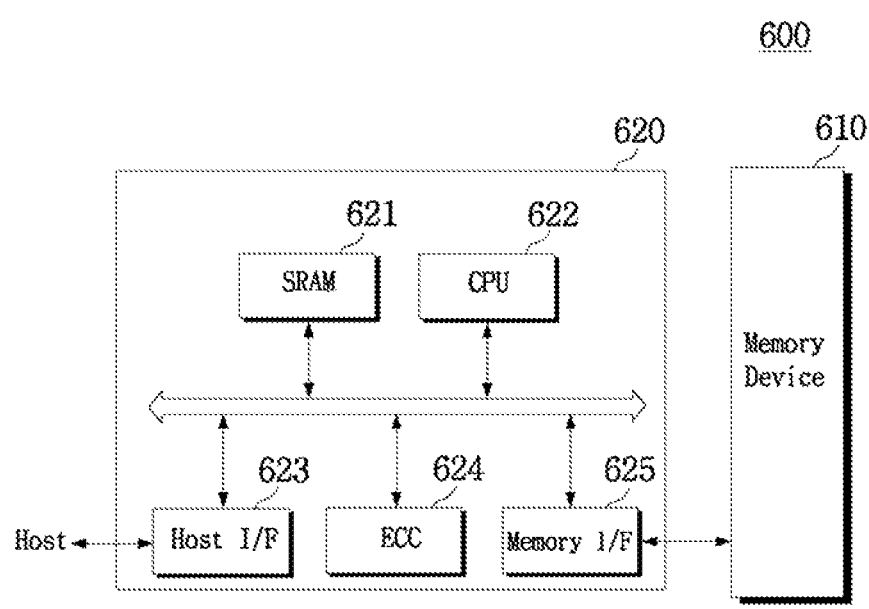
FIG. 10 is a block diagram schematically illustrating a memory system including a memory device in accordance with an embodiment of the present invention.

FIG. 10 is a block diagram schematically illustrating a memory system 600 including a memory device 610 according to an embodiment of the present invention.

Referring to FIG. 10, the memory system 600 may include the memory device 610 and a memory controller 620.

The memory device 610 may include the semiconductor memory device according to an embodiment of the invention as described above, and may be operated in the manner described above. The memory controller 620 may control the memory device 610. For example, the combination of the memory device 610 and the memory controller 620, may be configured as a memory card or a solid state disk (SSD). The memory controller 620 may include a static random access memory (SRAM) 621, a central processing unit (CPU) 622, a host interface 623, an error correction code (ECC) block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the memory device 610.

The memory interface 625 may interface with the memory device 610. The CPU 622 may perform general control operations for data exchange of the memory controller 620.

Although not shown, it should become apparent to a person skilled in the art that the memory system 600 may further be provided with a ROM which stores code data for interfacing with the host. The memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device for example, the host through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 11:
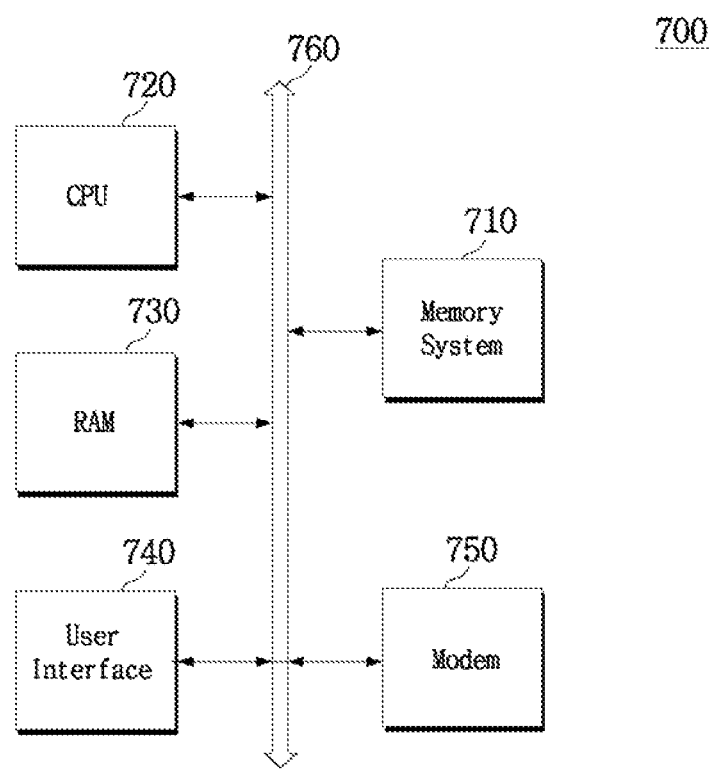
FIG. 11 is a block diagram schematically illustrating a computing system including a memory system in accordance with an embodiment of the present invention.

FIG. 11 is a block diagram schematically illustrating a computing system 700 including a memory system 710, according to an embodiment of the present invention.

Referring to FIG. 11, the computing system 700 according to the embodiment may include the memory system 710, a microprocessor or CPU 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CMOS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory for example, a NAND or a NOR flash memory.

It is noted that the above-described embodiments are realized only by a device and a method, however they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a semiconductor layer including a memory cell region;
a memory cell array including a plurality of first gate electrode layers stacked over the semiconductor layer, and disposed in the memory cell region; and
a capacitor circuit disposed over the semiconductor layer outside the memory cell region,
the capacitor circuit comprising:
a plurality of gate structural bodies each including second gate electrode layers stacked over the semiconductor layer, the plurality of gate structural bodies being arranged to be spaced apart along a first direction;
a plurality of electrodes disposed between the gate structural bodies; and
dielectric layers interposed between the gate structural bodies and the electrodes, and
wherein the electrodes comprise one or more first electrodes to which a first voltage is applied and one or more second electrodes to which a second voltage different from the first voltage is applied, and
wherein each of the first electrodes is electrically coupled to each of a plurality of first wiring lines and each of the second electrodes is electrically coupled to each of a plurality of second wiring lines.

2. The semiconductor memory device according to claim 1, wherein the gate structural bodies and the electrodes have line shapes extending in a second direction intersecting the first direction from a top view.

3. The semiconductor memory device according to claim 1, wherein the electrodes are formed to face side surfaces of the second gate electrode layers included in the gate structural bodies.

4. The semiconductor memory device according to claim 1, wherein the electrodes extend in a stack direction of the second gate electrode layers from a surface of the semiconductor layer.

5. The semiconductor memory device according to claim 1, wherein the second voltage is lower than the first voltage.

6. The semiconductor memory device according to claim 5, wherein the first electrodes and the second electrodes are alternately disposed in the first direction.

7. The semiconductor memory device according to claim 5, wherein the first voltage comprises a power supply voltage, and the second voltage comprises a ground voltage.

8. The semiconductor memory device according to claim 5, further comprising:
one or more first contacts disposed over the first electrodes; and
one or more second contacts disposed over the second electrodes, and
wherein the first wiring lines a disposed over the first contacts and are electrically coupled to the first electrodes through the first contacts, and
the second wiring lines are disposed over the second contacts and are electrically coupled to the second electrodes through the second contacts.

9. The semiconductor memory device according to claim 8, wherein the first wiring lines and the second wiring lines extend in a direction intersecting with an extending direction of the first and the second electrodes.

10. The semiconductor memory device according to claim 1, wherein a stack number of the first gate electrode layers and a stack number of the second gate electrode layers are the same.

11. The semiconductor memory device according to claim 1, wherein the second gate electrode layers are disposed at the same layers as the first gate electrode layers, respectively.

12. The semiconductor memory device according to claim 11, wherein a first gate electrode layer and a second gate electrode layer which are disposed at the same layer are formed of the same material.

13. The semiconductor memory device according to claim 1, further comprising:
a peripheral circuit formed between a substrate and the semiconductor layer.

14. The semiconductor memory device according to claim 1, wherein side surfaces of the second gate electrode layers included in the respective gate structural bodies are aligned with one another.

15. A semiconductor memory device comprising:
a peripheral circuit disposed at a first level over a substrate; and
a memory cell array and a capacitor circuit disposed at a second level over the substrate,
the capacitor circuit comprising:
- a plurality of gate structural bodies each including gate electrode layers stacked in a vertical direction perpendicular to the substrate, the plurality of gate structural bodies being arranged to be spaced apart along a first direction;
- a plurality of electrodes disposed in openings between the gate structural bodies; and
- dielectric layers formed between the gate structural bodies and the electrodes, and wherein the electrodes comprise one or more first electrodes to which a first voltage is applied and one or more second electrodes to which a second voltage different from the first voltage is applied, and wherein each of the first electrodes is electrically coupled to each of a plurality of first wiring lines and each of the second electrodes is electrically coupled to each of a plurality of second wiring lines.

16. The semiconductor memory device according to claim 15, wherein at least a portion of the peripheral circuit overlaps with the memory cell array and the capacitor circuit in the vertical direction.

17. The semiconductor memory device according to claim 15, wherein the first level is closer to the substrate than the second level in the vertical direction.

18. The semiconductor memory device according to claim 17, further comprising:
- a dielectric layer formed over the substrate to cover the peripheral circuit; and
- a semiconductor layer disposed over the dielectric layer, and serving as a base layer of the memory cell array and the capacitor circuit.

19. A semiconductor memory device comprising:
- a plurality of gate structural bodies each including gate electrode layers stacked over a semiconductor layer, the plurality of gate structural bodies being arranged to be spaced apart along a first direction;
- a plurality of electrodes disposed between the gate structural bodies; and
- dielectric layers interposed between the gate structural bodies and the electrodes, and wherein the electrodes comprise one or more first electrodes to which a first voltage is applied and one or more second electrodes to which a second voltage different from the first voltage is applied, and wherein each of the first electrodes is electrically coupled to each of a plurality of first wiring lines and each of the second electrodes is electrically coupled to each of a plurality of second wiring lines.

* * * * *